United States Patent [19]
Kim et al.

[11] Patent Number: 5,744,970
[45] Date of Patent: Apr. 28, 1998

[54] MEASURING APPARATUS AND METHOD OF A PERMITTIVITY OF A DIELECTRIC MATERIAL

[75] Inventors: Ki Chai Kim, Kyungsanbuk-do; Se Yong Ro, Kyungki-do, both of Rep. of Korea

[73] Assignee: LG Electronics Inc., Seoul, Rep. of Korea

[21] Appl. No.: 813,108

[22] Filed: Mar. 7, 1997

Related U.S. Application Data

[63] Continuation of Ser. No. 500,512, Jul. 11, 1995, abandoned.

[30] Foreign Application Priority Data

Nov. 15, 1994 [KR] Rep. of Korea ............... 29888/1994

[51] Int. Cl.$^6$ .................................................. G01R 27/04
[52] U.S. Cl. ...................... 324/636; 324/642; 324/632; 324/633
[58] Field of Search ................................ 324/636, 642, 324/643, 633, 634, 635, 632

[56] References Cited

U.S. PATENT DOCUMENTS

| | | | |
|---|---|---|---|
| 3,889,182 | 6/1975 | Easley | 324/636 |
| 3,953,796 | 4/1976 | Keller | 324/636 |
| 4,277,741 | 7/1981 | Faxvog | 324/636 |
| 5,157,337 | 10/1992 | Neel et al. | 324/633 |
| 5,187,443 | 2/1993 | Bereskin | 324/633 |

FOREIGN PATENT DOCUMENTS

| | | | |
|---|---|---|---|
| 155840 | 1/1963 | U.S.S.R. | 324/636 |
| 208032 | 12/1967 | U.S.S.R. | 324/636 |

OTHER PUBLICATIONS

Zaltsman: "Perfected Method of Measuring Dielectric Permitivity..."—Meas. Tech. (USA)—vol. 20—(Jul. 1977)—(pp. 1072–1075).

McPhun et al. Mar. 1972 Simple Resonator Method for Measuring Dispersion of Microstrip.

Sproull et al. May 1946 Rosonant Cavity Measurements.

Benadda et al. Jan. 1982 A measuring device for the determination of the electric permittivity of materials in the frequency range 0.1–300 Hz.

Mehmet et al. Jul. 1970 Microwave Measurement of Thin Film Dielectric Properties.

Works et al Mar. 1947 Resonant Cavities for Dielectric Measurements.

Buzin et al. Dec. 1974 Dynamic method of measuring Q of Dielectric Resonators.

Pointon et al. Mar. 1971 A coaxial cavity for measuring the dielectric properties of high permittivity materials.

*Primary Examiner*—Ernest F. Karlsen
*Assistant Examiner*—Jose M. Solis
*Attorney, Agent, or Firm*—John P. White; Cooper & Dunham LLP

[57] ABSTRACT

A measuring apparatus and method of a permittivity of a dielectric material employs a cavity and a variable reactance connected to the outside the cavity to measure the permittivity of the dielectric material, in which a power-feeding post is installed within the cavity, the variable reactance for forcibly resonating the cavity is attached to the upper portion of the cavity at the end of the power-feeding post, a network analyzer is connected to the power-feeding post, and the dielectric material specimen to be measured fills up the cavity, so that the length of the variable reactance is adjusted to forcibly resonate the cavity and, at this time, the length of the variable reactance is measured to determine the permittivity of the dielectric material. Thus, unknown permittivity is simply measured while enabling the broadband measurement. A small cavity at a cut-off state is employed to be suitable for measuring the permittivity in a low frequency band.

7 Claims, 4 Drawing Sheets

MEASURING APPARATUS AND METHOD OF A PERMITTIVITY OF A DIELECTRIC MATERIAL

This application is a continuation of U.S. Ser. No. 08/500,512, filed Jul. 11, 1995, now abandoned.

BACKGROUND OF THE INVENTION

1. Field of the Invention

The present invention relates to an apparatus of measuring a permittivity and method therefor, and more particularly to a measuring apparatus and measuring a permittivity of a dielectric material, in which the permittivity of the dielectric material is measured by using a small cavity at a cut-off state and a variable reactance connected to the outside the cavity.

2. Description of the Prior Art

The development of a shielding material, an electric-wave absorption material, and a dielectric material used for various parts such as a printed circuit board has been actively made to decrease unnecessary electric wave generally emitted from electronic information processors, etc.

Also, a method for analyzing the characteristics of the shielding material, absorption material and dielectric material becomes of importance. Methods of waveguide, cavity resonance, perturbation, and the like are currently known as the method for measuring a constant of a dielectric material.

However, the conventional method for measuring the constant of the dielectric material is not suitable for measurement in a low frequency band, and it is impossible to measure a broad band.

SUMMARY OF THE INVENTION

Accordingly, it is an object of the present invention to provide a measuring apparatus and measuring of a permittivity of a dielectric material by controlling a small cavity at a cut-off state and a variable reactance connected to the outside of the cavity to allow for measuring the permittivity in a low frequency band and a broad band.

To achieve the above object of the present invention, there is provided a measuring apparatus and method of measuring a permittivity of a dielectric material, in which a power-feeding conductor is installed within a cavity, a variable reactance is attached to the upper portion of the cavity at the end of the power-feeding post for forcibly resonating the cavity, a network analyzer is connected to the power-feeding conductor, a dielectric material specimen fills up the inside of the cavity, so that the length of the variable reactance is adjusted to to forcibly resonate the cavity, and, at this time, the length of the variable reactance is measured to determine the permittivity of the dielectric material.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

Figure 1:
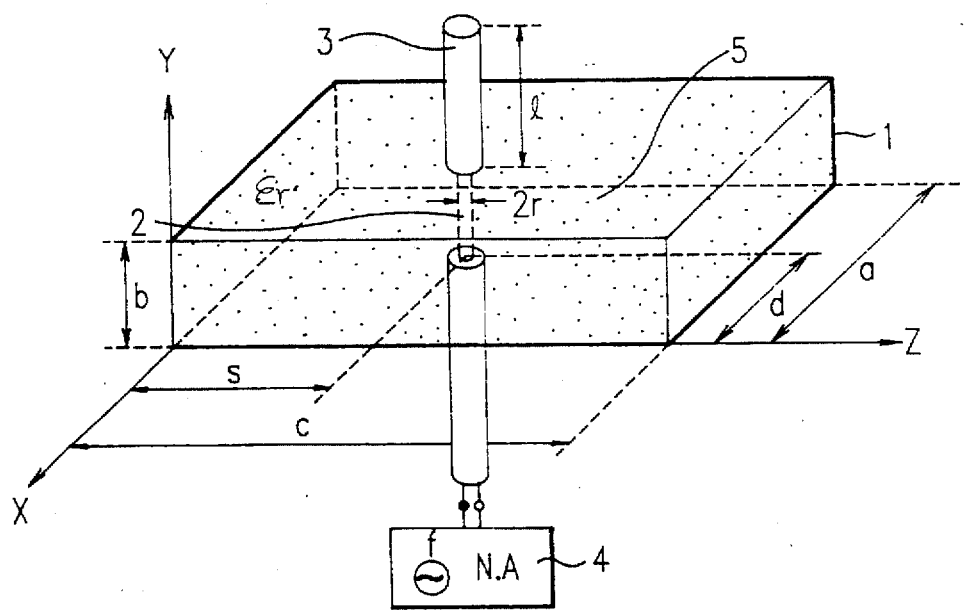
FIG. 1 is a view showing a structure of a permittivity measuring apparatus according to the present invention and coordinates thereof.

Referring to FIG. 1, a permittivity measuring apparatus according to the present invention will be described in detail.

A power-feeding conductor 2 having the radius of r is installed on a position S within a cavity 1 of which section is a×b and length is c. A variable reactance 3 for forcibly resonating cavity 1 is attached to the upper portion of cavity 1 at the end of power-feeding post 2. Also, power-feeding conductor 2 is connected with a network analyzer 4 for measuring a constant of a circuit, and a dielectric material specimen to be measured 5 having a dielectric constant $\epsilon_r$ which will be simply referred to as "permittivity" unless a special reason occurs) fills up cavity 1.

Here, network analyzer 4 may be replaced with a signal generator.

Also, the dimensional characteristic of the present measuring apparatus is in that cavity 1 is a small cavity at a constantly cut-off state when the dielectric material to be measured does not fill up cavity 1.

Variable reactance 3 attached to the upper portion of cavity 1 is formed by utilizing a transmission line with a shorted end of a length l.

By adjusting the length l of variable reactance 3 formed as above, small cavity 1 filled with the dielectric material to be measured 5 can be forcibly resonated. In other words, length l of variable reactance 3 is adjusted to forcibly resonate cavity 1 filled with the dielectric material to be measured 5.

At this time, since permittivity $\epsilon_r$ of dielectric material specimen to be measured 5 filling up the inside of forcibly-resonated cavity 1 is determined by length l of variable reactance 3, permittivity $\epsilon_r$ of dielectric material specimen to be measured 5 can be obtained by measuring length l of variable reactance 3.

A measuring method of the permittivity of the dielectric material by means of the permittivity measuring apparatus of the dielectric material according to the present invention constructed as above will be described.

There is provided the measuring apparatus having the structure that power-feeding conductor 2 is installed within electrically small cavity 1, and variable reactance 3 is attached to the outside cavity 1.

Dielectric material specimen to be measured 5 fills up the inside of small cavity 1 of the measuring apparatus, length l of variable reactance 3 is adjusted to forcibly resonate cavity 1.

At this time, length l of variable reactance 3 for resonating cavity 1 is measured to determine the permittivity of the dielectric material.

Here, permittivity $\epsilon_r$ is determined by length l of variable reactance 3 when forcibly resonating cavity 1, in which permittivity $\epsilon_r$ with respect to length l of variable reactance 3 can be measured according to the following relation of a resonant frequency f and an impedance Zc as below:

$$\tan^{-1}\left\{\frac{-1}{jZcy_{22}(\epsilon_r f)}\right\} = Kol$$

The principle of measuring the permittivity by the forcible adjustment of the variable reactance connected to the outside of the electrically small cavity will be described.

After filling up dielectric material specimen to be measured 5 the inside of small cavity 1, the value of variable reactance 3 is forcibly adjusted to resonate small cavity 1. At this time, if information, i.e., information with respect to the length of the variable reactance in this embodiment, with respect to external variable reactance 3 for resonating cavity 1 can be identified, the permittivity of the dielectric material specimen to be measured 5 can be simply obtained.

More specifically, providing that the following equation (1) is applied as a resonating condition at a power-feeding point of the cavity, and the length of the variable reactance that satisfies the conditional equation (1) of the resonance is determined, the relation between the length of the variable reactance and permittivity when resonating at the measuring frequency can be obtained:

$$\text{IM}\{Z_{in}(\epsilon_r, f, X(l))\} = 0 \quad (1)$$

where $Z_{in}$ denotes an impedance of the power-feeding point of the cavity while the variable reactance is connected, which is a function of the measuring frequency, permittivity and length of the variable reactance.

Here, Im denotes an imaginary part of a complex number.

In the above equation (1), the reference symbol X(l) is the value of the variable reactance which can be constituted by using a distributed integer line of length l.

In order to obtain the relation between permittivity $\epsilon_r$ and variable reactance length l at the measuring frequency f, the above equation (1) should be solved.

For solving equation (1), it is required to primarily calculate the cavity power-feeding impedance.

The detailed formula thereof will be described hereinbelow.

To begin with, the dielectric material to be measured (permittivity $\epsilon_r$, $\mu r=1$) fills up the inside the cavity, which is driven by $\delta$ functional power of a voltage V at the position of the power-feeding conductor that y=0.

If the $\delta$ functional voltage is supposed at a loading point of the post that y=b, an integral equation with respect to a current distribution J on the power-feeding conductor is obtained as:

$$\frac{1}{j\omega\epsilon}\int\int_{s'}(\bar{I}k^2 + \nabla GH\times D)\cdot\overline{G}(r,r')J(r')\cdot dS' = $$

$$-V\delta(y)\hat{y} + jX1(b)\delta(y-b)\hat{y} \quad (2)$$

where $$k = \omega\sqrt{\epsilon\mu_0} = k_0\sqrt{\epsilon_r}$$

$$k_0 = \omega\sqrt{\epsilon_0\mu_0}$$

$$\epsilon = \epsilon_r\epsilon_0$$

$$\epsilon_r = \epsilon'_r - j\epsilon''_r$$

providing that reference symbol y denotes a unit vector in the y-direction, $\bar{I}$ is a unit dyadic, $\delta(*)$ is a delta function of Dirac, $\omega$ is respective frequencies, and time is varied by exp(jwt).

Also, reference symbol r is a positional vector of an observation point, r' is a positional vector of a wave starting point, I(b) is a current value at the loading point to which the variable reactance is connected.

Reference symbol S' is the surface of the conductor assuming that the radius of the conductor is provided to be far smaller than the wave utilized to allow the current to flow concentratively along the center thereof.

Additionally, it is supposed that the dielectric material of low loss is mounted within cavity 1.

In equation (2), $\overline{G}$ is an electric dyadic Green function, which is represented as follows:

$$\overline{G} = \quad (3)$$

$$\hat{y}\hat{y}\sum_{n=1}^{\infty}\sum_{m=0}^{\infty}\frac{-2\epsilon_{0m}}{ab\Gamma_{nm}}\sin\frac{n\pi x}{a}\cos\frac{m\pi y}{b}\sin\frac{n\pi x'}{a}\cos\frac{m\pi y'}{b}L_{nm}(z,z')$$

where, since reference symbol $\epsilon_{0m}$ is a coefficient of Neumann, $$L_{nm}(z,z') = \begin{bmatrix} \frac{\sinh\Gamma_{nm}z'}{\sinh\Gamma_{nm}c}\sinh\Gamma_{nm}(z-c), z>z' \\ \frac{\sinh\Gamma_{nm}z}{\sinh\Gamma_{nm}c}\sinh\Gamma_{nm}(z'-c), z<z' \end{bmatrix} \quad (4)$$

only that $$\Gamma_{nm} = \sqrt{\left(\frac{n\pi}{a}\right)^2 + \left(\frac{m\pi}{b}\right)^2 - k_0^2\epsilon_r}$$

Also, equation (2) represents that a connection component of an electric field on the surface of the conductor is the same as the electric field by the variable reactance connected to the outside the cavity and the power-feeding voltage. The integral equation (2) with respect to the current distribution flowing along the power-feeding conductor arranged inside the cavity is solved by a moment method.

An unknown current distribution is approximately developed by a familiar function as below, that is:

$$J = \sum_{q=0}^{Q} a_q\cos\frac{q\pi y}{b} \quad (5)$$

where, reference symbol $a_q$ is an unknown expansion coefficient.

By substituting equation (5) for integral equation (2) and using Galerkin method, the integral equation can be written by the following simple equation:

$$\sum_{q=0}^{Q} a_q Z_{qq'} = V_{q'} \quad (6)$$

where q'=0,1,2, ..., Q
Here, $$Z_{qq'} = \frac{1}{j\omega\epsilon}\int\int_s\int\int_{s'}\cos\frac{n\pi y}{b}\hat{y}\cdot(\bar{I}k^2 + \nabla\nabla)\cdot \quad (7)$$

$$\overline{G}(r,r')\cdot\hat{y}\cos\frac{n\pi y'}{b}dS'dS$$

$$V_q = -V\int\int_s\cos\frac{n\pi y}{b}\hat{y}\cdot\delta(y)\hat{y}dS + \quad (8)$$

-continued $$jX1(b) \oint \int_s \cos\frac{n\pi y}{b} \hat{y} \cdot \delta(y-b)\hat{y}dS$$

In order to numerically solve the above equation (6), it is needed to reduce Q by a proper limited term in the development equation (5) relating to the current distribution.

In this embodiment, the impedance at the power-feeding point of the cavity can be obtained with a stable value, provided that Q equals 50.

The cavity of FIG. 1 can be expressed as a network of two ports in view of the power-feeding point and loading point thereof.

Assuming that the reference numerals $V_1$, $V_2$ and $I_1$, $I_2$ respectively designate the voltage and current of a first port and a second port, the voltage and current relations of respective ports can be defined as follows when an admittance parameter is utilized:

$$\begin{pmatrix} i_1 \\ i_2 \end{pmatrix} = \begin{pmatrix} Y_{11} & -Y_{12} \\ -Y_{21} & Y_{22} \end{pmatrix} \begin{pmatrix} V_1 \\ V_2 \end{pmatrix} \quad (9)$$

Here, the first port denotes a power source terminal, and the port 2 is a load terminal to which the variable reactance is attached.

The load terminal port 2 is connected with the variable reactance jx to form the following relation.

$$i_2 = -\frac{v_2}{jX} \quad (10)$$

By substituting equation (10) for equation (9), the power-feeding point impedance of the cavity is obtained as:

$$Z_{in}^{-1} = y_{11}(\epsilon_r,f) - \frac{y_{12}^2(\epsilon_r,f)}{y_{22}(\epsilon_r,f) + (jX)^{-1}} \quad (11)$$

In this equation (11), since the admittance parameter $y_{ij}$ includes information with respect to the permittivity of the dielectric material to be measured as well as the dimension of the cavity, it can be calculated by using the above moment method by giving the measuring frequency.

Also, the resonating condition of the above-stated equation (1) can be written as follows by applying it into the equation (11) of the power-feeding impedance of the cavity.

$$\frac{y_{22}(\epsilon_r,f) + (jX)^{-1}}{y_{11}(\epsilon_r,f)\{y_{22}(\epsilon_r,f) + (jX)^{-1}\} - y_{12}^2(\epsilon_r,f)} = 0 \quad (12)$$

Here, if a variable short-circuit consisting of the transmission line of length 1 with the shorted end is utilized as the variable reactance as described above, the variable reactance X is given as:

$$X = Z_c \tan(Kol) \quad (13)$$

where the reference symbol $Z_c$ is the characteristic impedance of the short-circut.

By substituting variable reactance X of the above equation (13) for equation (12), the relation between the permittivity and the variable reactance length when the cavity is resonated can be obtained.

In more detail, the following equation is obtained by arranging equation (12).

$$\tan^{-1}\left\{\frac{-1}{jz_cy_{22}(\epsilon_r,f)}\right\} = Kol \quad (14)$$

In the above equation (14), 50Ω is used as the characteristic impedance $Z_c$ of the variable short-circuit.

Because the expression equation of the permittivity with respect to the length of the variable impedance is difficult to be obtained, a transcendental equation of equation (14) is formally considered as a decision equation of the permittivity.

Therefore, if the variable reactance length 1 is identified when the cavity is resonated in the measuring frequency, the length is substituted for the right term of equation (14), so that permittivity $\epsilon_r$ satisfying equation (13) can be obtained.

Figure 2A:
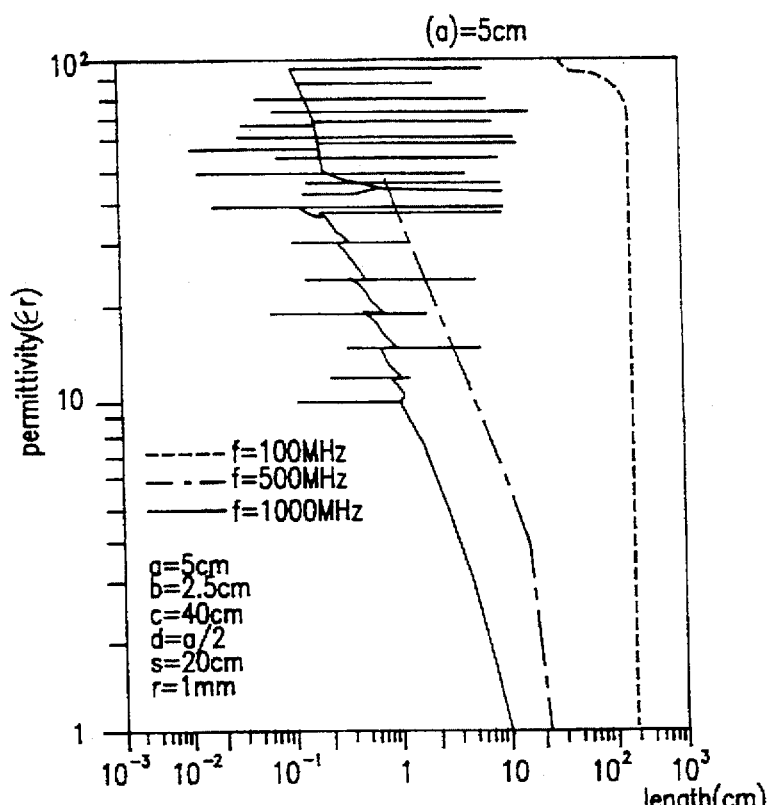
FIGS. 2A and 2B are views for illustrating the permittivity with respect to a reactance length according to the present invention.
Figure 2B:
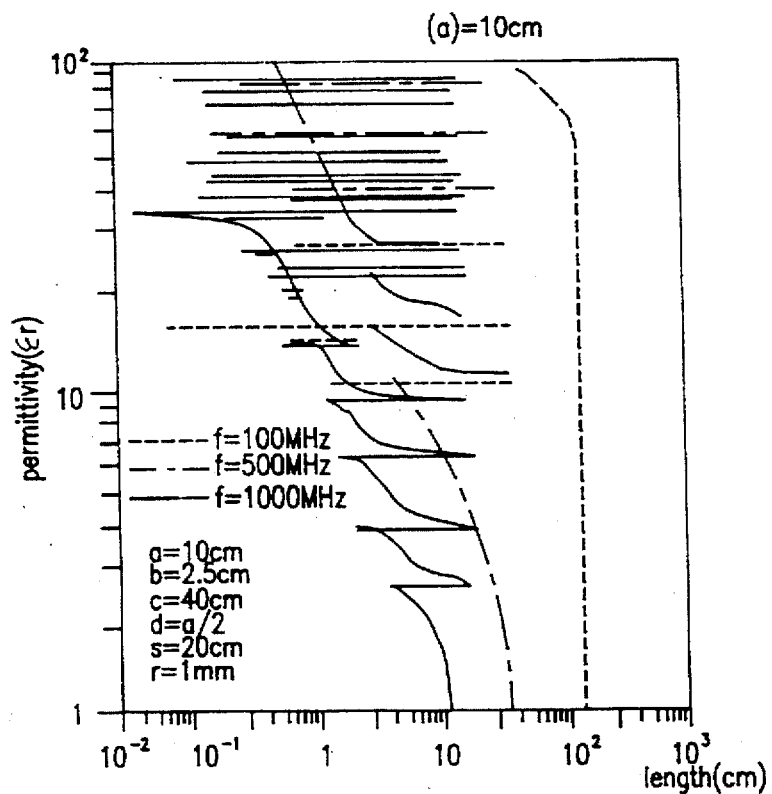

FIGS. 2A and 2B illustrate the permittivity with respect to the length.

When the length during the resonance can be identified, the permittivity can be obtained.

Also, it can be noted that, as the frequency is heightened, the resonance can occur even though there is no variable reactance, i.e., X=0.

First, in FIG. 2A, the permittivity of a first non-loaded resonance is approximately 9.5 in case of 1000 MHz.

In addition, since a plurality of permittivities are measured with respect to a single length (variable reactance) at a portion which is vibrated beyond the first non-loaded resonance, a gentle portion lower than the first non-loaded resonance becomes mainly utilized.

Moreover, as can be noted in FIGS. 2A and 2B, the permittivity of considerably low frequency can be measured regardless of using a small cavity according to the present invention.

That is, according to the present measuring method, the measurable frequency range is not only the broad band, but also, the permittivity having the first non-loaded resonance becomes greater as the width a of the cavity is small, so that the measurable permittivity range is enlarged.

Figure 3A:
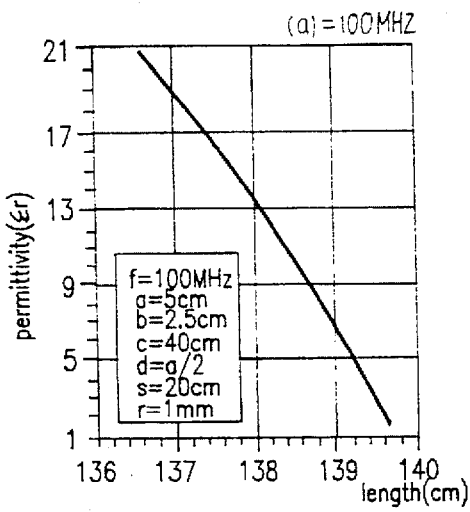
FIGS. 3A to 3C are views for illustrating the permittivity with respect to the reactance length obtained by enlarging FIG. 2A.
Figure 3B:
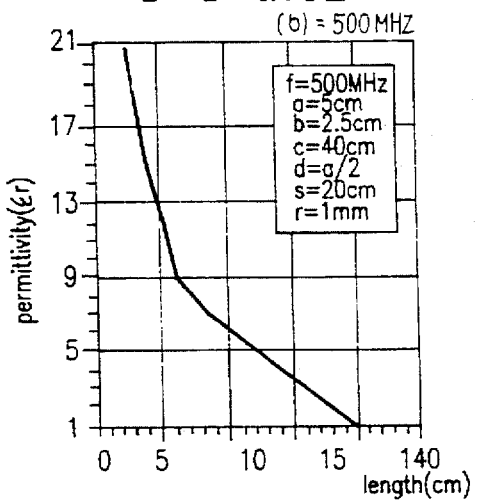
Figure 3C:
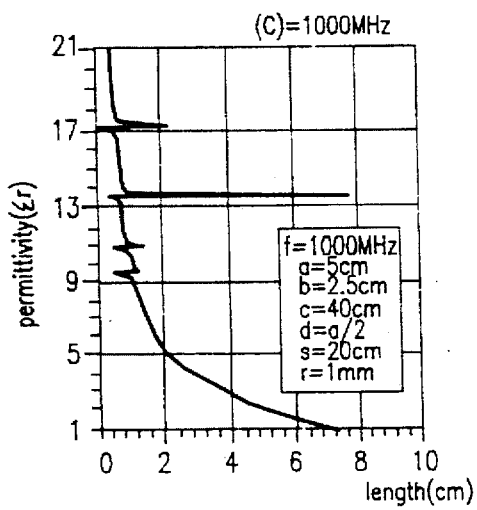

FIGS. 3A, 3B and 3C represent the permittivity with respect to the reactance length respectively enlarging the frequency of FIG. 2A.

As shown in FIGS. 3A, 3B and 3C, the measurement sensitivity is not arbitrarily determined, in which, if a micrometer is employed as a driving part for adjusting the variable reactance value, the length thereof can be measured to 0.001 mm. Therefore, the highly-finite permittivity can be measured.

Figure 4A:
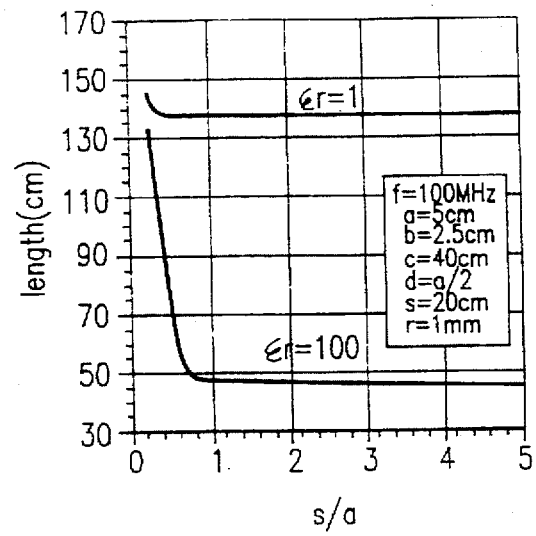
FIGS. 4A and 4B are views for illustrating the reactance length with respect to the cavity length according to the present invention.
Figure 4B:
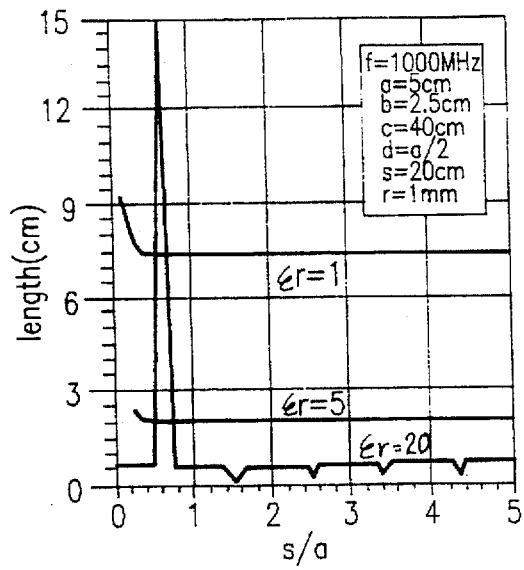

FIGS. 4A and 4B illustrate the reactance length with respect to the length of the cavity.

If it is taken that S=1.5 a as the position of the power-feeding conductor by the relation between the position of the power-feeding conductor (and the length of the cavity) standardized with the width of the cavity and the length of the variable reactance when taking the resonance in order to examine the influence of both walls of the cavity at the lengthwise position that Z=0=C, the influence of both walls affecting on the measurement of the permittivity can be ignored.

Referring to FIG. 4B, it can be noted that the non-loaded resonance appears in accordance with the S value when the permittivity is 20 (which is a roughly given as an example).

This means that, as can be perceived in FIG. 2, the non-loaded resonance can occur although the S value is changed in the permittivity liable to result in the non-loaded resonance and higher, i.e., in the permittivity belong to the resonating region in FIG. 2.

Furthermore, the non-loaded resonance resulting from the S value does not occur in the gentle region below the permittivity for initiating the first non-loaded resonance, and the influence by the resonance disappears when the S value exceeds a prescribed value.

For example, when $\epsilon_r=1$ and $\epsilon_r=5$ as shown in FIG. 4B, the non-loaded resonance by the S value does not occur in the gentle region below the permittivity causing the first non-loaded resonance, and the influence by the resonance is eliminated when the S value exceeds a prescribed value.

Figure 5:
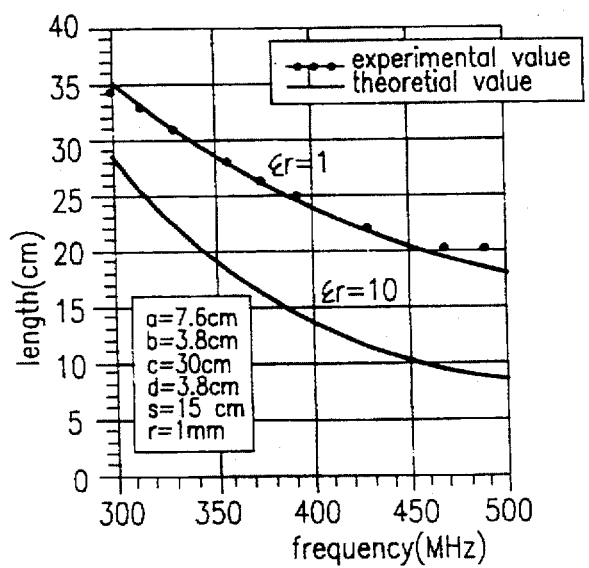
FIG. 5 shows the relation between the reactance length and frequency according to the present invention.

FIG. 5 shows the relation between the reactance length and frequency.

The cavity utilized in the experiment is formed of an aluminum having the dimensions of 7.6×3.8×40 cm.

The external reactance employs a coaxial variable short-circuit available on the market to measure the permittivity in a free space.

As illustrated in FIG. 5, the theoretical value and experimental value of the reactance length and frequency are correspondent to each other.

The measuring apparatus and method of a permittivity of a dielectric material according to the present invention as described above has advantages as follows.

First, a small cavity and a variable reactance electrically connected to the outside the cavity are employed to utilize a forcible resonance of the cavity by controlling the variable reactance, thereby measuring the variable reactance length during the resonance. Thus, an unknown permittivity can be simply measured.

Second, the present invention enables a broadband measurement, and especially, the small cavity at a cut-off state is utilized to be suitable for measuring the permittivity in a low frequency band.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A measuring apparatus of a permittivity of a dielectric material comprising:

a power-feeding conductor installed within a cavity for supplying fixed frequency power;

a variable reactance attached to a surface of said cavity at the end of said power-feeding conductor for forcibly resonating said cavity by adjusting the length in accordance with the frequency of the supplied fixed frequency power; and a network analyzer connected to said power-feeding conductor to identify resonance of the cavity, wherein said cavity is an electrically small cavity at a non-resonating state when said dielectric material to be measured does not fill up said cavity.

2. A measuring method of a permittivity of a dielectric material comprising the steps of:

installing a power-feeding conductor within a cavity for supplying fixed frequency power;

attaching a variable reactance to the upper portion of said cavity at the end of said power-feeding conductor for forcibly resonating said cavity;

connecting a network analyzer to said power-feeding conductor;

filling a dielectric material specimen within said cavity to forcibly resonate said cavity by adjusting the length of said variable reactance, and measuring the length of said variable reactance when said cavity is forcibly resonated to determine the permittivity of said dielectric material.

3. A measuring apparatus of a permittivity of a dielectric material as claimed in claim 1, wherein said variable reactance is formed of a transmission line having a shorted end.

4. A measuring apparatus of a permittivity of a dielectric material as claimed in claim 1, wherein the length of said variable reactance is adjusted for forcibly resonating said cavity filled with said dielectric material to be measured.

5. A measuring apparatus of a permittivity of a dielectric material as claimed in claim 4, wherein the permittivity of said dielectric material specimen to be measured filling up inside said forcibly-resonated cavity is determined by said length of said variable reactance.

6. A measuring method of a permittivity of a dielectric material as claimed in claim 2, wherein the permittivity when said cavity is forcibly resonated is determined by said length of said variable reactance.

7. A measuring method of a permittivity of a dielectric material as claimed in claim 6, wherein said permittivity when said cavity is forcibly resonated is measured by a relation between a frequency and a resonant length of said variable reactance as below:

$$\tan^{-1}\left\{\frac{-1}{jZ_c y_{22}(\xi_r f)}\right\} = K_o l$$

where f denoted said frequency and l is resonant length of said variable reactance.

* * * * *